United States Patent [19]
Yokoya et al.

[11] Patent Number: 5,334,945
[45] Date of Patent: Aug. 2, 1994

[54] POWER CONTROL CIRCUIT

[75] Inventors: Satoshi Yokoya; Nobutaka Takao, both of Kanagawa, Japan

[73] Assignee: Sony Corporation, Tokyo, Japan

[21] Appl. No.: 21,238

[22] Filed: Feb. 23, 1993

[30] Foreign Application Priority Data

Mar. 11, 1992 [JP] Japan .................. 4-087800

[51] Int. Cl.$^5$ ............................................ H03G 3/20
[52] U.S. Cl. ............................ 330/129; 330/135; 330/207 P; 330/279; 330/298; 455/117; 455/127
[58] Field of Search ............ 330/134, 135, 129, 207 P, 330/279, 298, 297; 455/112, 115, 116, 117, 127; 307/540

[56] References Cited
U.S. PATENT DOCUMENTS

| | | | |
|---|---|---|---|
| 4,729,129 | 3/1988 | Koerner | 330/207 P |
| 5,038,112 | 8/1991 | O'Neill | 330/207 P |
| 5,252,929 | 10/1993 | Taroumaru | 330/134 |

*Primary Examiner*—James B. Mullins
*Assistant Examiner*—J. Dudek
*Attorney, Agent, or Firm*—Lewis H. Eslinger; Jay H. Maioli

[57] ABSTRACT

A power control circuit for use in radio transmitters such as portable telephone sets includes a power amplifier for amplifying the power of a transmission signal to obtain an output signal; control circuits for controlling the amplitude of the signal output by the power amplifier; a limiter for partially limiting the amplitude of the signal from the power amplifier in order to obtain a limited signal; a multiplication circuit for multiplying the limited signal from the limiter and part of the signal from the power amplifier in order to acquire a multiplied signal; a low-pass filter for extracting a DC component of the multiplied signal from the multiplication circuit; and a comparison circuit for comparing the DC component from the low-pass filter with a reference voltage in order to obtain a comparison output. The comparison output from the comparison circuit is supplied to the control circuits, and the control circuits control the level of the signal from the power amplifier so that the DC component from the low-pass filter will become equal to the reference voltage regardless of temperature change.

2 Claims, 4 Drawing Sheets

POWER CONTROL CIRCUIT

BACKGROUND OF THE INVENTION

1. Field of the Invention

The present invention relates to a power control circuit for use in radio transmitters such as portable telephone sets.

2. Description of the Prior Art

In movable telephone systems such as a cellular phone system, it is the base station that controls or changes the transmission output of each of the mobile stations configured. This scheme is adopted so that the distance of radio transmissions stemming from each mobile station may be minimized and that the same frequency may be used by different mobile stations in different locations without interference therebetween. This allows the system to accommodate, under its control, the largest possible number of mobile stations that may communicate with one another.

To have its transmission output changed externally, the mobile station employs a transmission output section shown illustratively in FIG. 4. In FIG. 4, reference numeral 11 is a microphone; 12 is a transmission circuit; 13 is a power amplifier; 14 is a microstrip line; 15 is a band-pass filter for an outgoing channel; and 16 is a transmitter-receiver antenna.

During a transmission, a voice signal S11 from the microphone 11 is fed to the transmission circuit 12. The transmission circuit 12 converts the voice signal S11 to an outgoing channel transmission signal (FM signal) S12. The transmission signal S12 is amplified in power by the power amplifier 13 to become a signal S13. The power-amplified signal S13 passes through the microstrip line 14 and a filter 15 before reaching the antenna 16. From the antenna 16, the signal is transmitted by radio to the base station.

Reference numeral 20 represents a microcomputer for system control. The microcomputer 20 receives from the base station predetermined command signals or data via the transmission circuit 12 and via a reception circuit, not shown. In turn, these command signals or data allow the microcomputer 20 to control the transmission circuit 12 and the reception circuit.

Reference numeral 30 represents an APC circuit that controls the transmission output. In operation, the microcomputer 20 loads into a latch circuit 31 data D31 for designating the transmission output. From the latch circuit 31, the data D31 are sent to a D/A converter 32 for conversion to an analog voltage V32. The voltage V32 is supplied to a voltage comparison circuit 33 as the reference voltage. The signal S13 from the power amplifier 13 is sent to a detection circuit 34. This causes a DC voltage V34 to be output, the level of the voltage V34 corresponding to the level (i.e., amplitude) of the transmission signal S13. The DC voltage V34 is fed to the comparison circuit 33 for comparison with the reference voltage.

The emitter and collector of a transistor 36 are connected in series between a power terminal 35 and the power line of the amplifier 13. A comparison output S33 from the voltage comparison circuit 33 is sent via a drive circuit 37 to the base of the transistor 36 as its control signal.

Thus the operating voltage fed to the amplifier 13 via the transistor 36 is varied in accordance with the comparison output S33. As the operating voltage of the amplifier 13 changes, so does the level of the transmission signal S13 output by the amplifier 13. The comparison circuit 33 provides feedback control such that V34=V32. That is, the level (=V34) of the transmission signal S13 from the amplifier 13 equals the level of the voltage V32.

The microcomputer 20 controls the value of the data D31 to manipulate the level of the transmission signal S13. That means the base station is capable of controlling the transmission output of each mobile station.

Generally, diodes have a temperature characteristic of about 2 mV/° C. In the setup of FIG. 4, the transmission signal S13 from the amplifier 13 is detected by a diode 34Da in the detection circuit 34 in order to obtain the voltage V34 indicating the level of the signal S13. It follows that the level of the voltage V34 varies with temperature.

If the mobile station is a mobile phone set mounted on board a vehicle, the phone body containing the transmission section shown in FIG. 4 is located in the vehicle's trunk. In such an environment, the temperature change to which the diode 34Da is subjected is significant. That means there occur appreciable temperature-induced changes in the detected output voltage V34. As a result, the transmission output fluctuates considerably.

The adverse effect above is countered conventionally by raising the level of the transmission signal S13 fed to the detection circuit 34. This increases the detected output voltage V34, which in turn reduces proportionately the temperature change in the voltage V34 and thus lowers the fluctuation of the transmission output. However, having the amplifier 13 feed the transmission signal S13 to the detection circuit 34 constitutes a loss of power from the viewpoint of transmitting the signal S13 via the antenna 16 in practice. The higher the raised level of the transmission signal S13 fed to the detection circuit 34, the greater the loss of power.

One way to bypass the disadvantage above is proposed in U.S. Pat. No. 4,523,155. That patent discloses a circuit arrangement wherein a diode 34Db constitutes a temperature compensation circuit. The temperature-induced change in the terminal voltage of the diode 34Db is arranged to cancel out the temperature-induced change in the detected output voltage V34 of the diode 34Da.

The proposed temperature compensation scheme has a number of disadvantages. For one thing, as shown in FIG. 4, the scheme requires the detecting diode 34Da and the temperature compensating diode 34Db to be kept at the same temperature. That is, the two diodes 34Da and 34Db must be located close to each other. Another disadvantage is as follows: the two diodes 34Da and 34Db allow different bias currents to flow therethrough. As a result, the forward voltage drops of the two diodes differ from each other, causing an offset voltage to be included in the detected output voltage V34 of the detection circuit 34.

SUMMARY OF THE INVENTION

It is therefore an object of the present invention to overcome the above and other deficiencies and disadvantages of the prior art and to provide a power control circuit that improves on the prior art.

In carrying out the invention and according to one aspect thereof, there is provided a power control circuit comprising: a power amplifier 13 (reference characters are those used in describing preferred embodiments below) for amplifying the power of a transmission signal S12 to obtain a signal S13; control circuits 36 and 37 for controlling the level of the signal S13 output by the power amplifier 13; a limiter 41 for partially limiting the amplitude of the signal S13 from the power amplifier 13 in order to obtain an output signal S41; a multiplication circuit 42 for multiplying the output signal S41 from the limiter 41 and part of the signal S13 from the power amplifier 13 in order to acquire an output signal S42; a low-pass filter 44 for extracting a DC component V44 of the output signal S42 from the multiplication circuit 42; and a voltage comparison circuit 33 for comparing the DC component V44 from the low-pass filter 44 with a reference voltage V32 in order to obtain a comparison output S33; wherein the comparison output S33 from the voltage comparison circuit 33 is supplied to the control circuits 36 and 37; and wherein the control circuits 36 and 37 control the level of the signal S13 from the power amplifier 13 so that the DC component V44 from the low-pass filter 44 will become equal to the reference voltage V32.

In operation, the multiplication circuit 42 detects, in synchronization, signals S42 and S43, to obtain a detected output S42. From the detected output S42, the low-pass filter 44 extracts the DC component V44 indicating the level of the transmission signal S13. The level of the transmission signal S13 is controlled in accordance with the DC component V44.

These and other objects, features, and advantages of the invention will become more apparent upon a reading of the following description and appended drawings.

DESCRIPTION OF THE PREFERRED EMBODIMENTS

Figure 1:
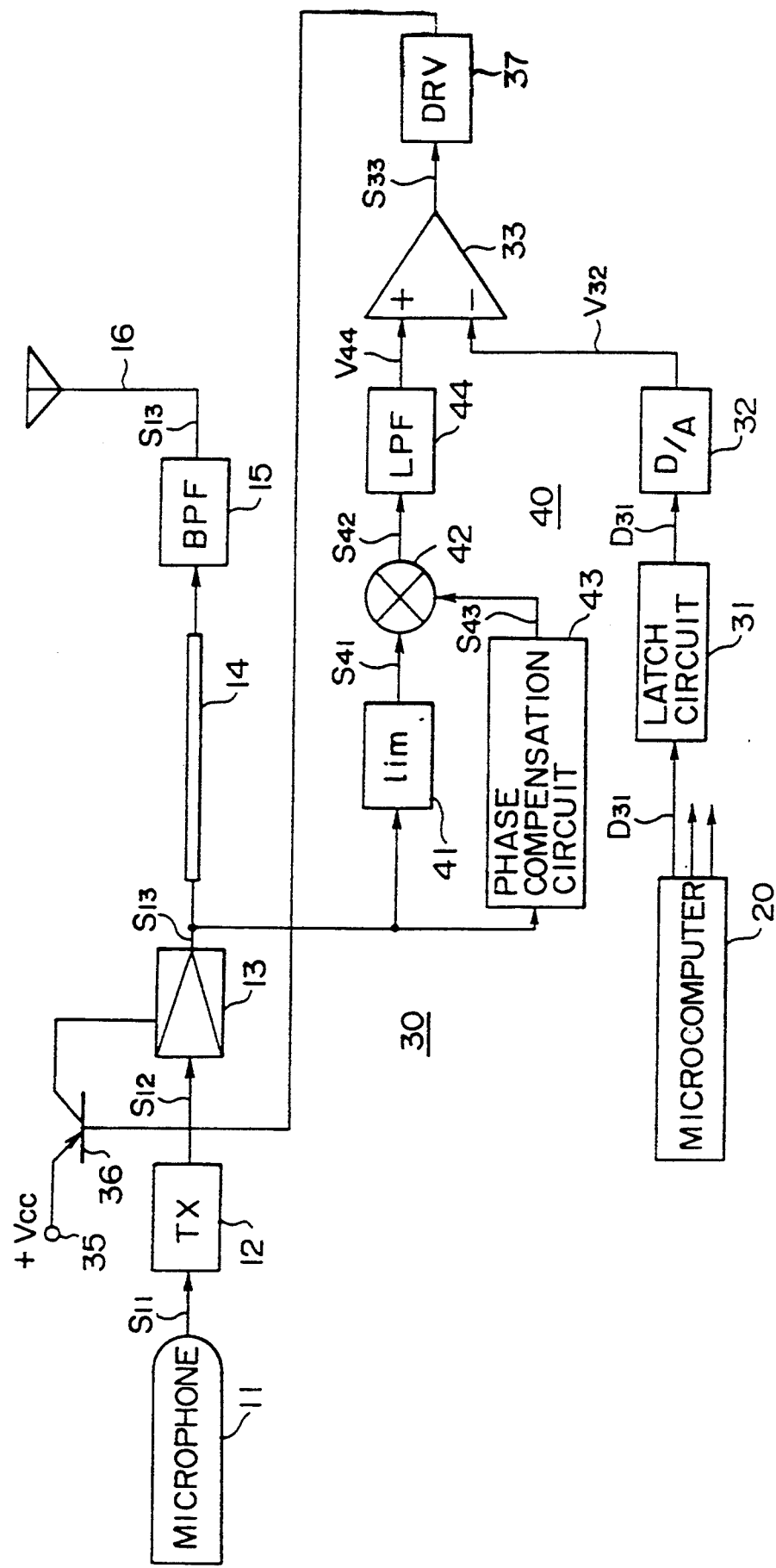
FIG. 1 is a schematic flow diagram of a first embodiment of the invention.

FIG. 1 is a schematic flow diagram of a first embodiment of the invention. In FIG. 1, reference numeral 40 indicates a level detection circuit. A transmission signal S13 from a power amplifier 13 is supplied to a limiter amplifier 41. In turn, the limiter amplifier 41 outputs a signal S41 having a constant amplitude. The signal S41 is sent as a switching signal to a multiplication circuit (mixer circuit) 42, illustratively of a double-balanced construction. The signal S13 from the amplifier 13 is also fed to a phase compensation circuit 43 having a constant gain. The phase compensation circuit 43 outputs a signal S43 whose level is proportionate to that of the signal S13 and whose phase is the same as that of the signal S41. The signal S43 is sent to the multiplication circuit 42.

A multiplication output S42 from the multiplication circuit 42 is supplied to a low-pass filter 44. From the multiplication output S42 thus received, the low-pass filter 44 extracts a DC component V44 and sends it to a voltage comparison circuit 33.

In the above setup, suppose that the signal S13 fed by the amplifier 13 to the limiter amplifier 41 is given as $$S13 = A\ cos(\omega t + \phi 13)$$

where, A stands for the amplitude, $\omega$ for the angular frequency, and $\phi$ for the phase. If it is assumed that K43 is the gain of the phase compensation circuit 43 and $\phi$43 is the amount of phase compensation by the phase compensation circuit 43 (=phase shift of limiter amplifier 41), then the signal S41 is given as $$S41 = 1 \cdot cos(\omega t + \phi 13 + \phi 43)$$

because the signal S41 from the limiter amplifier 41 amplifies an input transistor in the multiplication circuit 42 up to the switching level. The signal S43 output by the phase compensation circuit 43 is given as $$S43 = K43 \cdot A\ cos(\omega t + \phi 13 + \phi 43)$$

Thus if K43 is assumed to be the multiplication gain of the multiplication circuit 42, the signal S42 output by the multiplication circuit 42 is given as $$\begin{aligned} S42 &= K42 \cdot S41 \cdot S43 \\ &= K42 \cdot 1 \cdot cos(\omega t + \phi 13 + \phi 43) \times \\ & \quad K43 \cdot A\ cos(\omega t + \phi 13 + \phi 43) \\ &= (AK42K43/2)\{1 + cos(\omega t + \phi 13 + \phi 43)\} \end{aligned}$$

From the signal S42, the low-pass filter 44 extracts the DC component (=AK42K43/2) as the voltage V44. That is, what is extracted is $$V44 = AK42K43/2$$

where the values K42 and K43 remain constant. It follows that the voltage V44 represents the amplitude A of the signal S13 output by the amplifier 13.

The voltage V44 is fed to the comparison circuit 33 which performs feedback operations so that V44=V32. Thus the level of the transmission signal S13 is controlled when the microcomputer 22 controls the data D31 appropriately. In this manner, the base station controls the transmission output of each mobile station.

Figure 4:
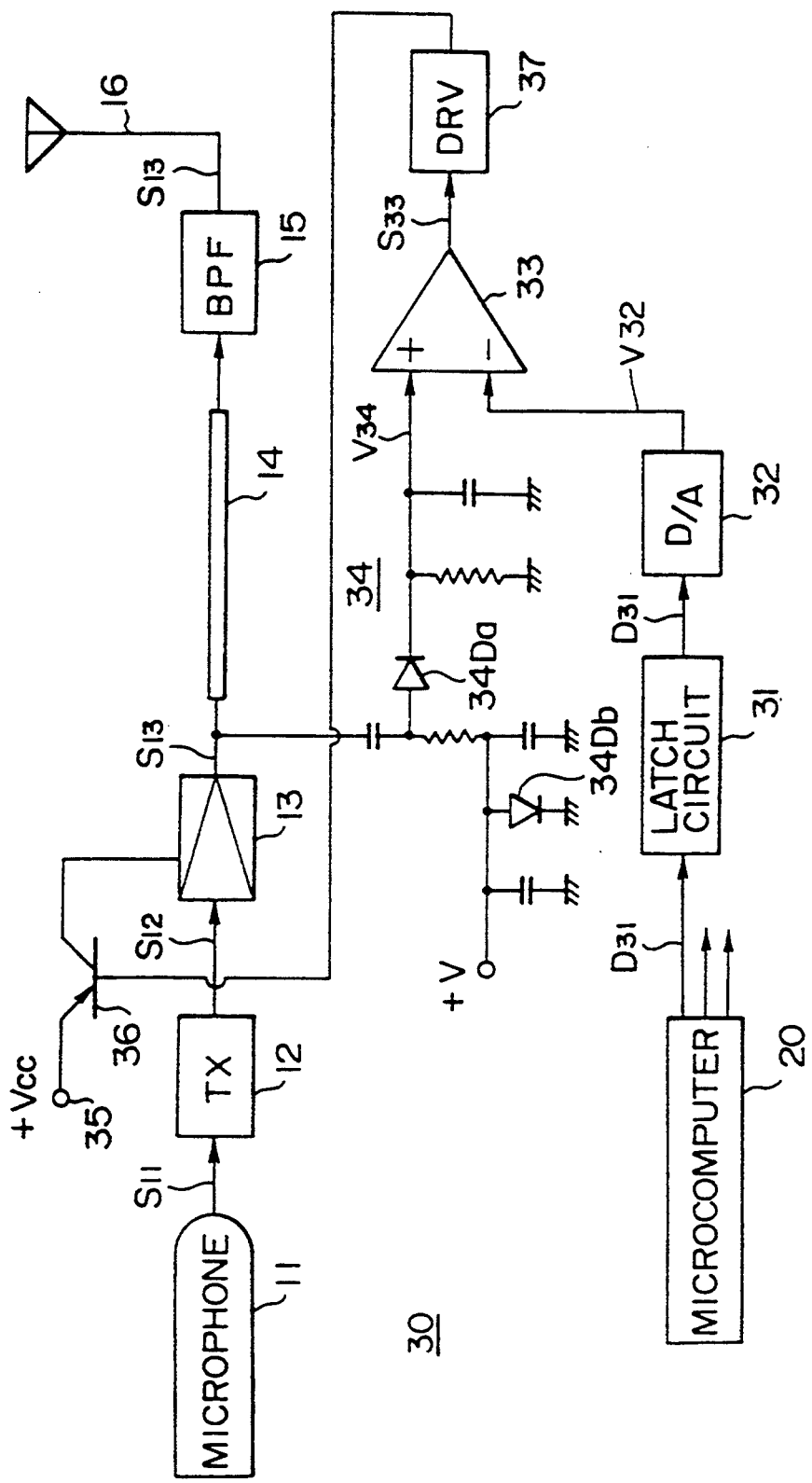
FIG. 4 is a schematic flow diagram of a typical prior art power control circuit.

In the first embodiment described above, unlike in the prior art setup of FIG. 4, there is no need to include a device having a temperature characteristic (such as a diode 34Da of a detection circuit 34 in FIG. 4) or a circuit that compensates that characteristic. Without such a device or circuit, the embodiment is still capable of radio transmission at the level designated by the base station regardless of temperature change.

The voltage V44 fed to the comparison circuit 33 is in linear proportion to the amplitude A of the transmission signal S13. This allows the transmission output to be controlled in an appropriate manner.

Furthermore, because only a small portion of the transmission signal S13 from the amplifier 13 is diverted to the circuits 41 and 43, there occurs virtually no loss of power in the signal S13 when it is transmitted by radio in practice.

Figure 2:
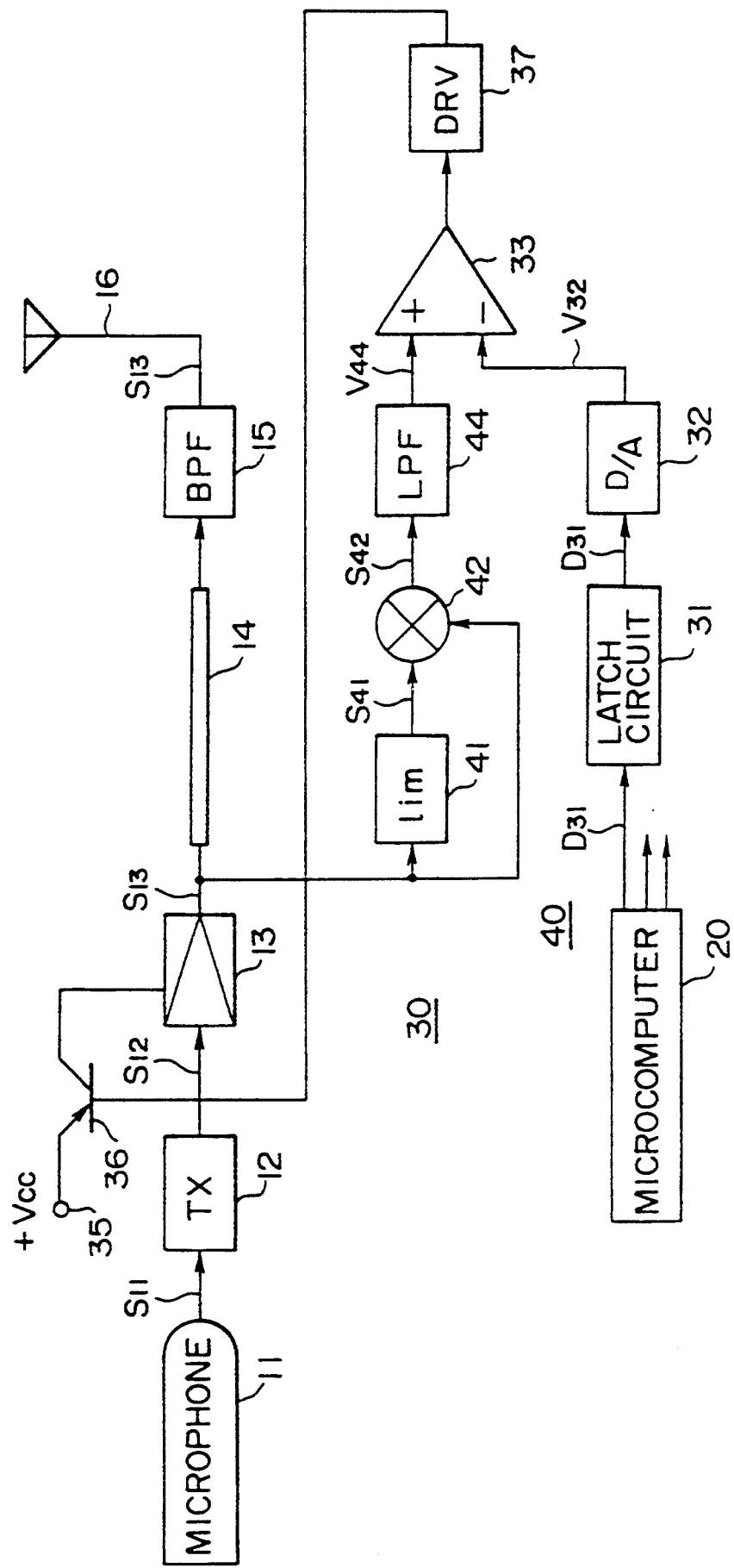
FIG. 2 is a schematic flow diagram of a second embodiment of the invention.

FIG. 2 is a schematic flow diagram of a second embodiment of the invention. In the second embodiment, the phase compensation circuit 43 of the first embodiment is omitted. This setup is feasible if the phase shift of the limiter amplifier 41 is negligible when it comes to detecting the amplitude A of the transmission signal S13.

Figure 3:
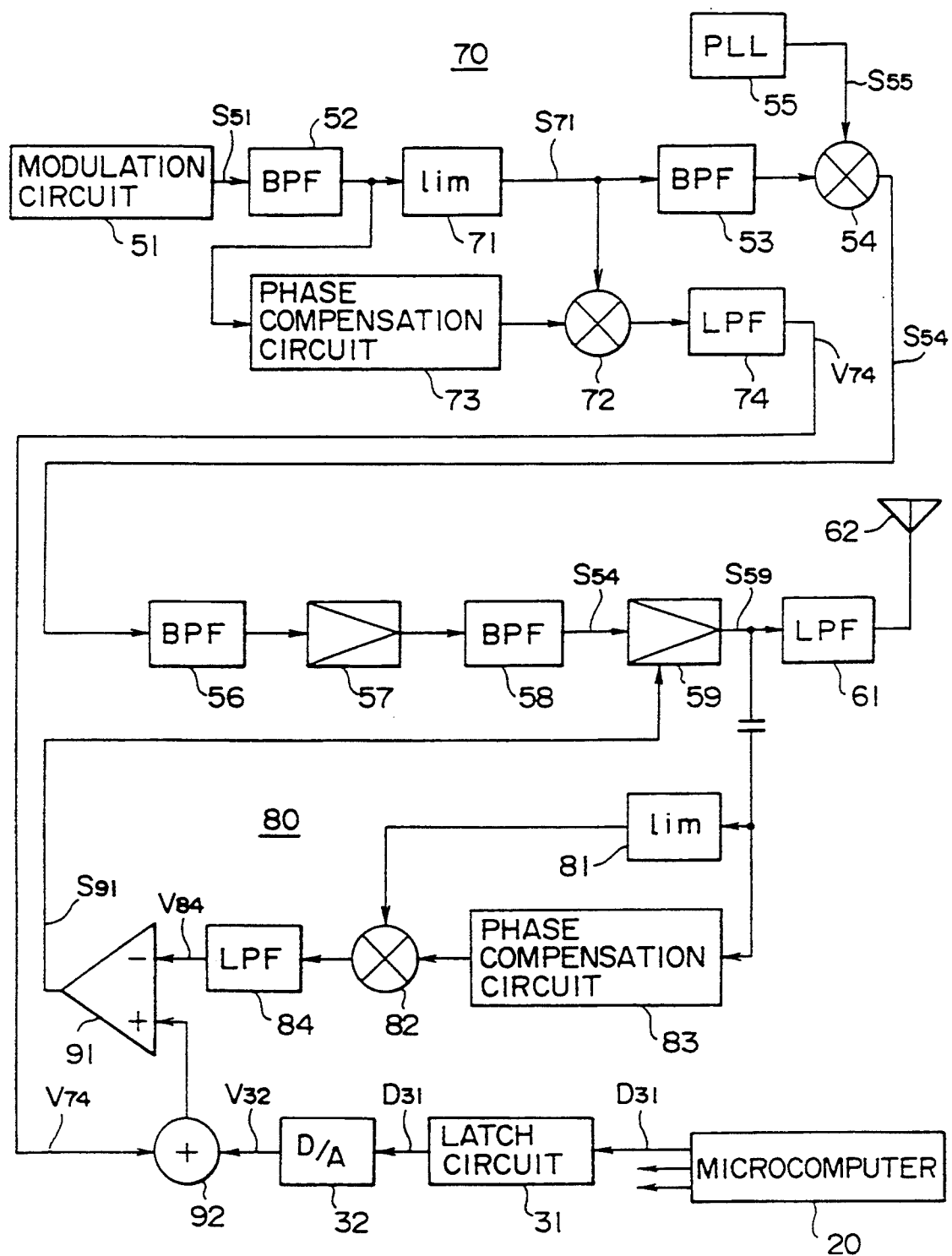
FIG. 3 is a schematic flow diagram of a third embodiment of the invention.

FIG. 3 is a schematic flow diagram of a third embodiment of the invention. This embodiment is a mobile station of a digital cellular phone system. A QPSK modulation signal S51 derived from a QPSK modulation circuit 51 is supplied to a limiter 71 and to a phase compensation circuit 73 via a band-pass filter 52. The limiter 71 and the phase compensation circuit 73, along with a multiplication circuit 72 and a low-pass filter 74, constitute a level detection circuit 70 equivalent to the level detection circuit 40 of FIG. 1.

The limiter 71 outputs a constant-amplitude signal S71 obtained by removing the amplitude information from the signal S51. That is, the signal S71 has only the phase information about the signal S51. The low-pass filter 74 outputs a voltage V74 indicating the amplitude of the signal S51.

The signal S71 from the limiter 71 is also fed to a mixer circuit 54 via a band-pass filter 53. A PLL circuit 55 for channel setting sends a carrier signal S55 to the mixer circuit 54. In turn, the mixer circuit 54 converts the signal S71 in frequency to a signal S54 for a designated channel. The signal S54 passes through a signal line comprising a band-pass filter 56, a drive amplifier 57 and a band-pass filter 58 before reaching a power amplifier 59 of class C amplification.

The amplifier 59 outputs a signal S59 that is obtained by amplifying the signal S54 in terms of power. The signal S59 is supplied to a transmitter-receiver antenna 62 via a low-pass filter 61 as well as to a limiter 81 and a phase compensation circuit 83. In this setup, the limiter 81 and the phase compensation circuit 83, along with a multiplication circuit 82 and a low-pass filter 84, constitute a level detection circuit 80 equivalent to the level detection circuit 40 of FIG. 1. That is, the low-pass filter 84 outputs a voltage V84 representing the amplitude of the signal S59.

The voltage V84 is fed to a voltage comparison circuit 91. The voltage V74 indicating the amplitude of the signal S51 is sent from the low-pass filter 74 to the comparison circuit 91 via an adder 92. In turn, the comparison circuit 91 outputs a comparison output S91 to the amplifier 59 as the signal for controlling the output level thereof.

Thus the signal S59 output by the amplifier 59 has its amplitude varied in accordance with the amplitude of the signal S51. Because the signal S59 has the phase information about the signal S51, the signal S59 is equivalent to the QPSK modulation signal S51 while being amplified in power by the amplifier 59.

Because the DC voltage V32 is extracted from the D/A converter 32 and supplied to the comparison circuit 91 via the adder 92, the level of the signal S59 from the amplifier 59 conforms to the voltage V32. It follows that the level of the signal 859 output by the amplifier 59 is controlled using the data D31 from the microcomputer 20. Thus in the third embodiment, the QPSK modulation signal S51 is amplified by the amplifier 59 of class C amplification.

As described above, and according to the invention, signals S42 and S43, derived from the transmission signal S13 are detected in synchronization. The detected output S42 is fed to the low-pass filter 44. This allows the level of the transmission signal S13 to be detected. Under this scheme, unlike in the prior art setup of FIG. 4, there is no need to include a device having a temperature characteristic (such as the diode 34Da of the detection circuit 34 in FIG. 4) or a circuit that compensates that characteristic. Without such a device or circuit, the invention as embodied above is still capable of radio transmission at the level designated by the base station regardless of temperature change.

The voltage V44 supplied to the comparison circuit 33 is in linear proportion to the amplitude A of the transmission signal S13. This makes it possible to control the transmission output appropriately.

Furthermore, only a small portion of the transmission signal S13 from the amplifier 13 is diverted to the circuits 41 and 43. As a result, there occurs virtually no loss of power in the signal S13 when it is transmitted by radio in practice.

While preferred embodiments of the invention have been described using specific terms, such description is for illustrative purposes only, and it is to be understood that changes and variations may be made by one skilled in the art without departing from the spirit or scope of the following claims.

What is claimed is:

1. A power control circuit for use in a mobile station of a mobile phone system, comprising:
   a power amplifier for amplifying a power of a transmission signal to obtain an output signal;
   control circuit means for controlling a level of the output signal output by said power amplifier;
   a limiter for partially limiting an amplitude of the output signal from said power amplifier in order to obtain a limited signal;
   a multiplication circuit for multiplying the limited signal from said limiter and part of the output signal from said power amplifier in order to acquire a multiplied signal;
   a low-pass filter for extracting a direct current component of the multiplied signal from said multiplication circuit; and
   a comparison circuit for comparing the direct current component from said low-pass filter with a reference voltage designated by a base station of said mobile phone system in order to obtain a comparison output;
   wherein the comparison output from said comparison circuit is supplied to said control circuit means; and
   wherein said control circuit means controls the level of the output signal from said power amplifier so that the direct current component from said low-pass filter will become equal to said reference voltage.

2. A power control circuit comprising:
   a power amplifier for power amplifying a transmission signal to obtain an output signal;
   control circuit means for controlling a level of the output signal output by said power amplifier;
   a limiter for partially limiting an amplitude of the output signal from said power amplifier in order to obtain a limited signal;
   a phase compensation circuit having a constant gain and to which the output signal form said power amplifier is supplied, said phase compensation circuit outputting a compensated signal, the level of the compensated signal from said phase compensation circuit being proportionate to the level of the output signal from said power amplifier, the phase of the compensation signal from said phase compensation circuit being the same as that of the limited signal from said limiter;
   a multiplication circuit for multiplying the limited signal from said limiter and the compensated signal from said phase compensation circuit in order to acquire a multiplied signal;

a low-pass filter for extracting a direct current component of the multiplied signal from said multiplication circuit; and a comparison circuit for comparing the direct current component from said low-pass filter with a reference voltage in order to obtain a comparison output;

wherein the comparison output from said comparison circuit is supplied to said control circuit means; and wherein said control circuit means controls the level of the output signal from said power amplifier so that the direct current component from said low-pass filter will become equal to said reference voltage.

* * * * *

UNITED STATES PATENT AND TRADEMARK OFFICE
CERTIFICATE OF CORRECTION

PATENT NO. : 5,334,945
DATED : August 2, 1994
INVENTOR(S) : Satoshi Yokoya and Nobutaka Takao It is certified that error appears in the above-indentified patent and that said Letters Patent is hereby corrected as shown below:

```
Col. 5, line 52, change "859" to --S59--
        line 58, change "S42" to   --S41--

Col. 6, line 56, change "form" to --from--
```

Signed and Sealed this

Twenty-eighth Day of May, 1996

Attest:

BRUCE LEHMAN

*Attesting Officer*     *Commissioner of Patents and Trademarks*